(12) United States Patent
Heo et al.

(10) Patent No.: US 11,862,704 B2
(45) Date of Patent: Jan. 2, 2024

(54) ELECTRONIC DEVICE AND METHOD OF MANUFACTURING THE SAME

(71) Applicant: Samsung Electronics Co., Ltd., Suwon-si (KR)

(72) Inventors: Jinseong Heo, Suwon-si (KR); Yunseong Lee, Osan-si (KR); Sanghyun Jo, Seoul (KR); Keunwook Shin, Yongin-si (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/059,660

(22) Filed: Nov. 29, 2022

(65) Prior Publication Data

US 2023/0104991 A1    Apr. 6, 2023

Related U.S. Application Data

(60) Division of application No. 17/154,354, filed on Jan. 21, 2021, now Pat. No. 11,538,918, which is a
(Continued)

(30) Foreign Application Priority Data

Sep. 18, 2018 (KR) .................... 10-2018-0111596

(51) Int. Cl.
*H01L 23/00* (2006.01)
*H01L 29/51* (2006.01)
*H01L 21/02* (2006.01)

(52) U.S. Cl.
CPC ........ *H01L 29/513* (2013.01); *H01L 21/0228* (2013.01); *H01L 21/02115* (2013.01);
(Continued)

(58) Field of Classification Search
CPC ................ H01L 29/513; H01L 21/02115
See application file for complete search history.

(56) References Cited

U.S. PATENT DOCUMENTS

| | | |
|---|---|---|
| 2011/0101309 A1 | 5/2011 | Lin et al. |
| 2012/0292677 A1 | 11/2012 | Dubourdieu et al. |
| 2016/0111180 A1 | 4/2016 | Joo et al. |
| 2016/0308070 A1 | 10/2016 | Chang et al. |
| 2017/0040331 A1 | 2/2017 | Van Houdt et al. |

(Continued)

FOREIGN PATENT DOCUMENTS

| | | |
|---|---|---|
| CN | 106054533 A | 10/2016 |
| CN | 106783174 A | 5/2017 |

(Continued)

OTHER PUBLICATIONS

H. J. Hwang et al., 'Ferroelectric polymer-gated graphene memory with high speed conductivity modulation' *Nanotechnology*, vol. 24, No. 17, Apr. 2013.
(Continued)

*Primary Examiner* — Anthony Ho
(74) *Attorney, Agent, or Firm* — Harness, Dickey & Pierce, P.L.C.

(57) ABSTRACT

Provided are electronic devices and methods of manufacturing the same. An electronic device may include a substrate, a gate electrode on the substrate, a ferroelectric layer between the substrate and the gate electrode, and a carbon layer between the substrate and the ferroelectric layer. The carbon layer may have an $sp^2$ bonding structure.

8 Claims, 11 Drawing Sheets

Related U.S. Application Data continuation of application No. 16/259,038, filed on Jan. 28, 2019, now Pat. No. 10,937,885.

(52) U.S. Cl.
CPC .. *H01L 21/02164* (2013.01); *H01L 21/02178* (2013.01); *H01L 21/02181* (2013.01); *H01L 21/02189* (2013.01); *H01L 21/02356* (2013.01); *H01L 29/516* (2013.01)

(56) References Cited

U.S. PATENT DOCUMENTS

| | | |
|---|---|---|
| 2017/0365719 A1 | 12/2017 | Chen et al. |
| 2018/0149966 A1 | 5/2018 | Shin et al. |
| 2019/0294047 A1 | 9/2019 | Shin et al. |

FOREIGN PATENT DOCUMENTS

| | | |
|---|---|---|
| EP | 3076239 A1 | 10/2016 |
| JP | 2011029399 A | 2/2011 |
| KR | 20090132874 A | 12/2009 |
| KR | 101335714 B1 | 12/2013 |
| KR | 101813186 B1 | 12/2017 |
| KR | 10-2018-0003666 A | 1/2018 |
| WO | WO-2013002601 A2 | 1/2013 |

OTHER PUBLICATIONS

M. Jaiswal et al., 'Controlled Hydrogenation of Graphene Sheets and Nanoribbons' *ACS Nano,* vol. 5, No. 2, Feb. 2011, pp. 888-896.

Z. Luo et al., 'Thickness-Dependent Reversible Hydrogenation of Graphene Layers' *ACS Nano,* vol. 3, No. 7, Jul. 2009, pp. 1781-1788.

Hiroshi Ishiwara, 'Current status of ferroelectric-gate Si transistors and challenge to ferroelectric-gate CNT transistors' *Current Applied Physics,* vol. 9, No. 1, Jan. 2009, pp. 52-56.

Extended European Search Report dated Dec. 12, 2019, issued in corresponding European Patent Application No. 19171989.7.

European Office Action dated Sep. 20, 2021, issued in corresponding European Patent Application No. 19 171 989.7.

Office Action dated Jul. 20, 2023 in Chinese Application No. 201910226482.5.

< Annealing >

ELECTRONIC DEVICE AND METHOD OF MANUFACTURING THE SAME

CROSS-REFERENCE TO RELATED APPLICATION

This application is a divisional of U.S. application Ser. No. 17/154,354, filed Jan. 21, 2021, which is a continuation of U.S. application Ser. No. 16/259,038 (now U.S. Pat. No. 10,937,885), filed Jan. 28, 2019, and claims the benefit of Korean Patent Application No. 10-2018-0111596, filed on Sep. 18, 2018, in the Korean Intellectual Property Office, the disclosures of each of which are incorporated herein in their entirety by reference.

BACKGROUND

1. Field

The present disclosure relates to electronic devices and methods of manufacturing the same.

2. Description of Related Art

Operating characteristics of general silicon (Si)-based electronic devices may not be easily improved, and such devices may not be easily scaled down. For example, in terms of operating voltage-current characteristics, a sub-threshold swing (SS) of general Si-based logic transistors may be limited to about 60 mV/dec. As such, when the size of a logic transistor is reduced, an operating voltage thereof may not be easily lowered to below about 0.8 V. Thus, power density may be increased and the logic transistor may not be easily scaled down.

SUMMARY

Provided are electronic devices and methods of manufacturing the same.

Additional aspects will be set forth in part in the description which follows and, in part, will be apparent from the description, or may be learned by practice of the presented embodiments.

According to an aspect of an embodiment, an electronic device may include a substrate, a gate electrode on the substrate, a ferroelectric layer between the substrate and the gate electrode, and a carbon layer between the substrate and the ferroelectric layer. The carbon layer may have having an $sp^2$ bonding structure.

In some embodiments, the substrate may include a channel element, a source, and a drain. The channel element may be in the substrate at a location corresponding to the gate electrode. The source and a drain may be provided at both sides of the channel element.

In some embodiments, the carbon layer may include nanocrystalline graphene including nano-sized crystals. The nanocrystalline graphene may include crystals having a size of about 0.5 nm to about 100 nm.

In some embodiments, in the nanocrystalline graphene, a ratio of carbon having an $sp^2$ bonding structure to total carbon may be about 50% to about 99%. The nanocrystalline graphene may contain about 1 atomic percent (at %) to about 20 at % of hydrogen. The electronic device may further include an insulating layer between the substrate and the carbon layer.

In some embodiments, the electronic device may further include an insulating layer between the carbon layer and the ferroelectric layer.

In some embodiments, the gate electrode may include a conductive metal or a carbon material having an $sp^2$ bonding structure.

In some embodiments, the ferroelectric layer may include an oxide including at least one of silicon (Si), aluminum (Al), hafnium (Hf), and zirconium (Zr). The oxide may further include a dopant. The carbon layer may have a thickness of about 0.4 nm to about 100 nm.

According to an aspect of another embodiment, a method of manufacturing an electronic device may include preparing a substrate including a channel element, depositing a carbon layer having an $sp^2$ bonding structure on the channel element, depositing a ferroelectric layer on the carbon layer, depositing a gate electrode on the ferroelectric layer, and crystallizing the ferroelectric layer through an annealing process.

In some embodiments, the preparing the substrate may include forming a source and a drain at both sides of the channel element.

In some embodiments, the method may further include generating an insulating layer between the substrate and the carbon layer.

In some embodiments, the method may further include generating an insulating layer between the carbon layer and the ferroelectric layer.

In some embodiments, the depositing of the carbon layer may be performed by chemical vapor deposition (CVD) or atomic layer deposition (ALD).

In some embodiments, the carbon layer may include nanocrystalline graphene including nano-sized crystals. The depositing the carbon layer may include forming the carbon layer so a thickness of the carbon layer is in a range about 0.4 nm to about 100 nm. The thickness of the carbon layer may be in a range of 0.4 nm to 100 nm.

In some embodiments, the depositing of the ferroelectric layer may be performed by CVD or ALD.

According to an aspect of another embodiment, an electronic device may include a channel element, a source and a drain connected to opposite ends of the channel element, a gate electrode on the channel element, a ferroelectric layer between the channel element and the gate electrode, and a carbon layer between the channel element and the ferroelectric layer. The gate electrode may be spaced apart from the source, drain, and channel element. The carbon layer may be configured to limit diffusion of at least one of metal or oxygen from the ferroelectric layer into the channel element.

In some embodiments, the electronic device may further include an insulating layer on the channel element. The insulating layer may be between the channel element and the ferroelectric layer, or the insulating layer may be between the gate electrode and the ferroelectric layer.

In some embodiments, the carbon layer may include nanocrystalline graphene including nano-sized crystals.

In some embodiments, the channel element may be a channel layer or a protruding portion of a substrate.

In some embodiments, the ferroelectric layer may include an oxide including at least one of silicon (Si), aluminum (Al), hafnium (Hf), and zirconium (Zr).

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
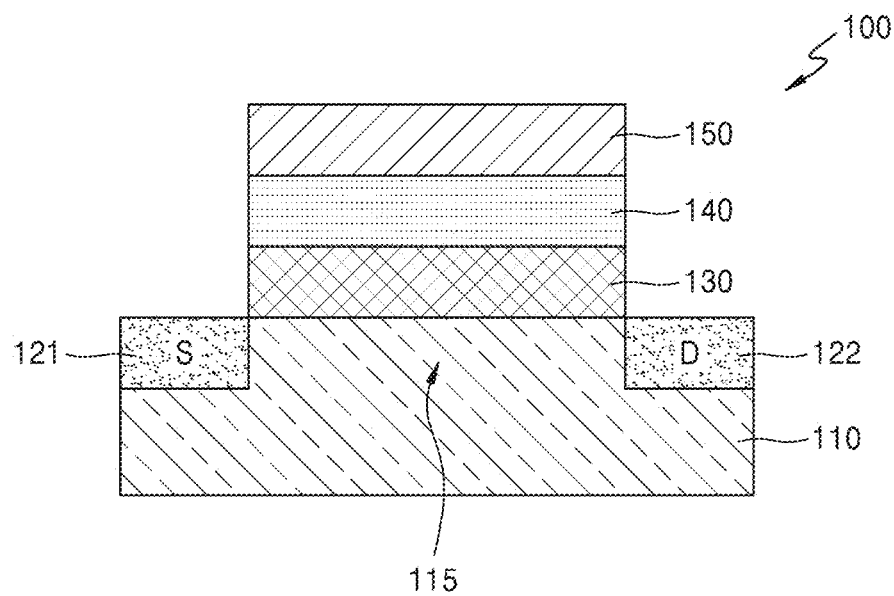
FIG. 1 is a cross-sectional view of an electronic device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, expressions such as "at least one of," when preceding a list of elements, modify the entire list of elements and do not modify the individual elements of the list.

It will be understood that when an element is referred to as being "on" another element, it may be directly on the other element, or an intervening element may also be present. As used herein, the singular forms "a", "an", and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Throughout the specification, "the" or similar demonstrative expressions may refer to both a singular form and a plural form. Also, unless an order of operations of a method is clearly indicated or contradicted by the context, the operations may be performed in an appropriately variable order and are not limited to the described order. All examples or terms introducing examples are used merely to describe the present disclosure in detail and do not limit the scope of the present disclosure unless defined in the claims.

In the following description, an electronic device according to embodiments is a semiconductor-based device and may have a gate stack structure including a ferroelectric and a gate electrode. The electronic device may include, for example, a logic device or a memory device.

FIG. 1 is a cross-sectional view of an electronic device 100 according to an example embodiment.

Referring to FIG. 1, the electronic device 100 includes a substrate 110, and a carbon layer 130, a ferroelectric layer 140, and a gate electrode 150 sequentially stacked on the substrate 110. A channel element 115 may be provided in the substrate 110 at a location corresponding to the gate electrode 150, and a source (S) 121 and a drain (D) 122 may be provided at both sides of the channel element 115.

The source 121 may be electrically connected to a side of the channel element 115, and the drain 122 may be electrically connected to the other side of the channel element 115. The source 121 and the drain 122 may be formed by implanting impurities into different regions of the substrate 110, and a region of the substrate 110 between the source 121 and the drain 122 may be defined as the channel element 115.

The substrate 110 may be a semiconductor substrate. For example, the substrate 110 may be a silicon (Si) substrate or may be a substrate including a material other than Si, e.g., germanium (Ge), silicon-germanium (SiGe), or a group III-V semiconductor. In this case, the channel element 115 may include Si, Ge, SiGe, or the group III-V semiconductor. The material of the substrate 110 is not limited to the above-mentioned examples and may be variously changed. As will be described below, the channel element 115 may not be provided as a part of the substrate 110 and may be provided as a material layer separate from the substrate 110.

The carbon layer 130 is provided on an upper surface of the channel element 115 of the substrate 110. The carbon layer 130 may include carbon having an $sp^2$ bonding structure. The carbon layer 130 having an $sp^2$ bonding structure may include nanocrystalline graphene including nano-sized crystals. Herein, nanocrystalline graphene refers to graphene including nano-sized crystals. For example, nanocrystalline graphene may include crystals having a size that is greater than 0 nm and less than or equal to about 100 nm.

Normal crystalline graphene, nanocrystalline graphene according to embodiments, and an amorphous carbon layer will now be compared.

A ratio of carbon having an $sp^2$ bonding structure to total carbon may be obtained by measuring a D-parameter through x-ray photoelectron spectroscopy (XPS) analysis. Specifically, in XPS analysis, a peak shape of an Auger spectrum of carbon varies with the ratio of carbon having an $sp^2$ bonding structure to total carbon. The gap between the highest point and the lowest point on a D-parameter spectrum obtained by differentiating the peak shape serves as the D-parameter. Therefore, normal crystalline graphene, nanocrystalline graphene, and the amorphous carbon layer may be identified by measuring the D-parameter on the Auger spectrum of carbon. The content of hydrogen, which will be described below, may be obtained by performing composition analysis through, for example, Rutherford backscattering spectroscopy (RBS).

Normal crystalline graphene may also be called intrinsic graphene and may include crystals having a size greater than, for example, about 100 nm. The D-parameter of normal crystalline graphene on the Auger spectrum of carbon may be about 23 eV. In this case, the ratio of carbon having an $sp^2$ bonding structure to total carbon may be almost 100%. Normal crystalline graphene may contain almost no hydrogen. In addition, normal crystalline graphene may have a density of, for example, about 2.1 g/cc and have a sheet resistance of, for example, about 100 Ohm/sq to about 300 Ohm/sq.

Nanocrystalline graphene may include crystals smaller than those of normal crystalline graphene. Specifically, for example, nanocrystalline graphene may include crystals having a size of about 0.5 nm to about 100 nm. The D-parameter of nanocrystalline graphene on the Auger spectrum of carbon may be about 18 eV to about 22.9 eV. In this case, the ratio of carbon having an $sp^2$ bonding structure to total carbon may be, for example, about 50% to about 99%. Nanocrystalline graphene may contain, for example, about 1 atomic percent (at %) to about 20 at % of hydrogen. Nanocrystalline graphene may have a density of, for example, about 1.6 g/cc to about 2.1 g/cc and a sheet resistance greater than, for example, about 1,000 Ohm/sq.

The D-parameter of the amorphous carbon layer on the Auger spectrum of carbon may have a value between a D-parameter of diamond, e.g., about 13 eV, and the D-parameter of nanocrystalline graphene. In this case, the ratio of carbon having an $sp^2$ bonding structure to total carbon may be, for example, about 30% to about 50%. The amorphous carbon layer may contain, for example, more than about 20 at % of hydrogen.

The carbon layer 130 having an $sp^2$ bonding structure may be a carbon layer 130 including nanocrystalline graphene. The carbon layer 130 may be on the upper surface of the channel element 115 of the substrate 110. The carbon layer 130 may be formed by depositing nanocrystalline graphene on the upper surface of the channel element 115 of the substrate 110 through, for example, chemical vapor deposition (CVD) or atomic layer deposition (ALD). Herein, the carbon layer 130 may include, for example, about 1 layer to about 100 layers of nanocrystalline graphene, but is not limited thereto. The carbon layer 130 may have a thickness of about 0.4 nm to about 100 nm. For example, the carbon layer 130 may have a thickness of about 0.4 nm to about 10 nm. However, the carbon layer 130 is not limited thereto.

The ferroelectric layer 140 may be provided on an upper surface of the carbon layer 130 having an $sp^2$ bonding structure. A ferroelectric may have a non-centrosymmetric charge distribution in a unit cell of a crystallized material structure and thus may have spontaneous electric dipoles, e.g., spontaneous polarization. The ferroelectric may have remnant polarization by the dipoles without application of an external electric field. A polarization direction of the ferroelectric may be switched in domain units by an external electric field. The ferroelectric may have or may not have hysteresis characteristics depending on an external electric field, and the electronic device 100 may be implemented as a logic device or a memory device depending on whether the ferroelectric has or does not have hysteresis characteristics.

As will be described below, the ferroelectric layer 140 may be formed by depositing a certain ferroelectric material as an amorphous ferroelectric layer on the upper surface of the carbon layer 130 having an $sp^2$ bonding structure, by, for example, CVD or ALD, and then by crystallizing the amorphous ferroelectric layer through an annealing process.

The ferroelectric layer 140 may include an oxide including at least one of, for example, Si, aluminum (Al), hafnium (Hf), and zirconium (Zr). For example, the ferroelectric layer 140 may include at least one of Hf-based oxide and Zr-based oxide. Herein, the Hf-based oxide may include, for example, HfO or HfZrO, and the Zr-based oxide may include, for example, ZrO.

In some embodiments, the ferroelectric layer 140 may further include a dopant. The dopant may include at least one of, for example, Si, Al, Zr, yttrium (Y), lanthanum (La), gadolinium (Gd), strontium (Sr), and Hf, but is not limited thereto. When the ferroelectric layer 140 includes the dopant, the dopant may be doped at the same concentration everywhere or may be doped at different concentrations in different regions. Alternatively, different regions of the ferroelectric layer 140 may be doped with different dopants.

The gate electrode 150 may be provided on an upper surface of the ferroelectric layer 140. Herein, the gate electrode 150 may be positioned at a side opposite to the channel element 115 of the substrate 110. The gate electrode 150 may include a conductive metal. Alternatively, the gate electrode 150 may include a carbon material having an $sp^2$ bonding structure. Herein, the carbon material having an $sp^2$ bonding structure may include, for example, normal crystalline graphene or nanocrystalline graphene.

Since the electronic device 100 according to the current embodiment includes the ferroelectric layer 140, a sub-threshold swing (SS) of the electronic device 100 may be lowered.

Figure 2:
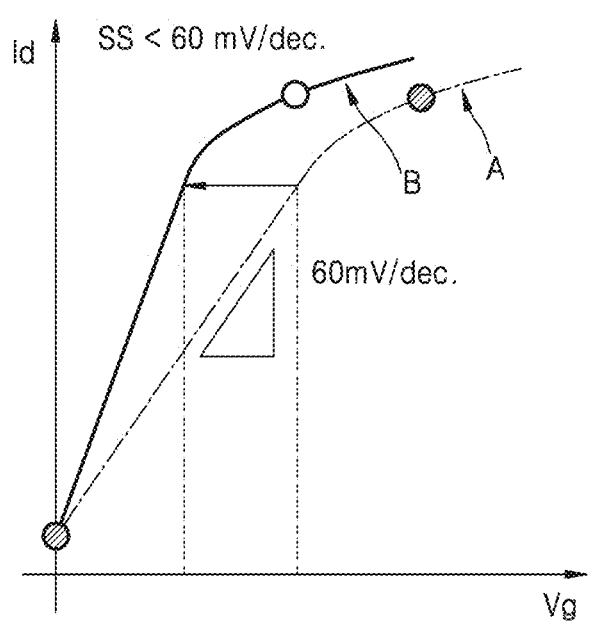
FIG. 2 is a graph for describing improvement of sub-threshold swing (SS) characteristics of an electronic device according to an example embodiment.

FIG. 2 is a graph for describing improvement of SS characteristics of a logic transistor according to an example embodiment. In FIG. 2, curve A indicates operating voltage Vg-current Id characteristics of a general Si-based logic transistor, and curve B indicates operating voltage Vg-current Id characteristics of the logic transistor according to an example embodiment.

Referring to FIG. 2, a SS of the general Si-based logic transistor may be limited to about 60 mV/dec. However, the logic transistor according to an example embodiment uses a ferroelectric layer and thus may lower a SS to below 60 mV/dec by voltage amplification occurring due to domain switching in a ferroelectric.

In the electronic device 100 according to the current embodiment, since the carbon layer 130 having an $sp^2$ bonding structure may be provided between the ferroelectric layer 140 and the channel element 115, diffusion of metal or oxygen in the ferroelectric layer 140 into the substrate 110 may be limited and/or prevented.

For example, in a Si-based electronic device including a ferroelectric layer and a metal layer, since metal or oxygen in the ferroelectric layer diffuses into a Si substrate due to a high temperature in an annealing process, electrical leakage may occur. In addition, since an undesired Si oxide layer or silicide is formed, characteristics of the electronic device may deteriorate. However, in the electronic device 100 according to the current embodiment, since the carbon layer 130 having an $sp^2$ bonding structure may be provided between the ferroelectric layer 140 and the substrate 110, the carbon layer 130 having an $sp^2$ bonding structure may limit and/or prevent diffusion of metal or oxygen in the ferroelectric layer 140 into the substrate 110 in a high-temperature annealing process. As such, current leakage may be limited and/or prevented and formation of an undesired Si oxide layer or silicide may also be limited and/or prevented. In addition, since the diffusion limitation and/or prevention effect may be achievable even when the carbon layer 130 having an $sp^2$ bonding structure may have a small thickness of about 1 nm, a total thickness of the electronic device 100 may be reduced. Therefore, the electronic device 100 may be easily scaled down.

Furthermore, in the electronic device 100 according to the current embodiment, since the carbon layer 130 having an $sp^2$ bonding structure may have a high charge density, an equipotential may be formed between the carbon layer 130 and the channel element 115. Therefore, the carbon layer 130 having an $sp^2$ bonding structure may screen a non-uniform electric potential due to a multi-domain structure of the ferroelectric layer 140 and thus may increase uniformity in characteristics of the electronic device 100.

Figure 3:
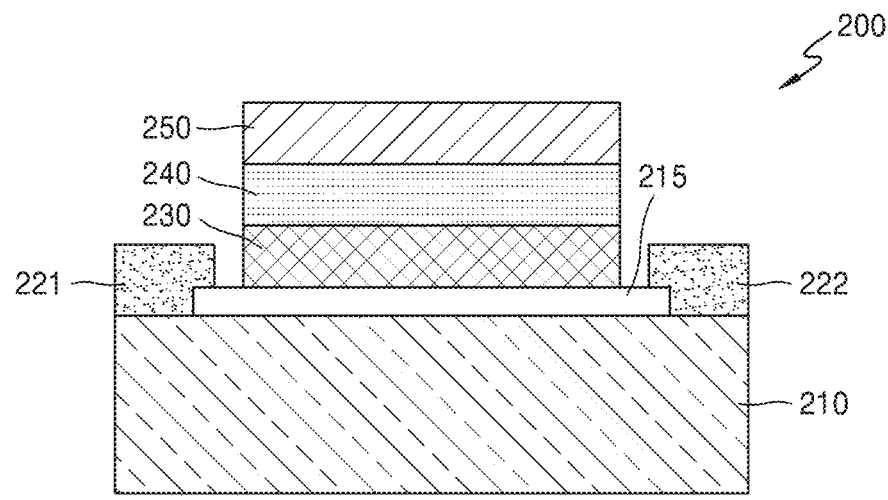
FIG. 3 is a cross-sectional view of an electronic device according to another example embodiment.

FIG. 3 is a cross-sectional view of an electronic device 200 according to another example embodiment. The following description is focused on differences from the aforedescribed embodiment.

Referring to FIG. 3, the electronic device 200 includes a substrate 210, and a channel layer 215, a carbon layer 230, a ferroelectric layer 240, and a gate electrode 250 sequentially stacked on the substrate 210, wherein the carbon layer 230 may have an $sp^2$ bonding structure. A source electrode 221 and a drain electrode 222 may be provided at both sides of the channel layer 215.

The substrate 210 may be a semiconductor substrate. For example, the substrate 210 may be a Si, Ge, SiGe, or a group III-V semiconductor, but is not limited thereto. The channel layer 215 may be provided on an upper surface of the substrate 210. The channel layer 215 may not be provided as a part of the substrate 210 and may be provided as a material layer separate from the substrate 210. The channel layer 215 may include at least one of, for example, an oxide semiconductor, a nitride semiconductor, an oxynitride semiconductor, a two-dimensional (2D) material, quantum dots (QDs), and an organic semiconductor. Herein, the oxide semiconductor may include, for example, InGaZnO, the 2D material may include, for example, transition metal dichalcogenide (TMD) or graphene, and the QDs may include, for example, colloidal or nanocrystal QDs. When the channel layer 215 includes graphene, the graphene may be treated, thickened (e.g., more than 5 monolayers of graphene), and/or narrowed (e.g., smaller than 10 nm) in order to make the band gap of the graphene in the channel layer 215 more than 0 eV. However, the above-mentioned materials are merely examples and the current embodiment is not limited thereto.

The source electrode 221 and the drain electrode 222 may be provided at both sides of the channel layer 215. The source electrode 221 may be connected to a side of the channel layer 215, and the drain electrode 222 may be connected to the other side of the channel layer 215. The source electrode 221 and the drain electrode 222 may be made of a conductive material such as a metal, a metal compound, or a conductive polymer.

The carbon layer 230, the ferroelectric layer 240, and the gate electrode 250 sequentially stacked on the channel layer 215 have been described above and thus detailed descriptions thereof will not be provided herein.

Figure 4:
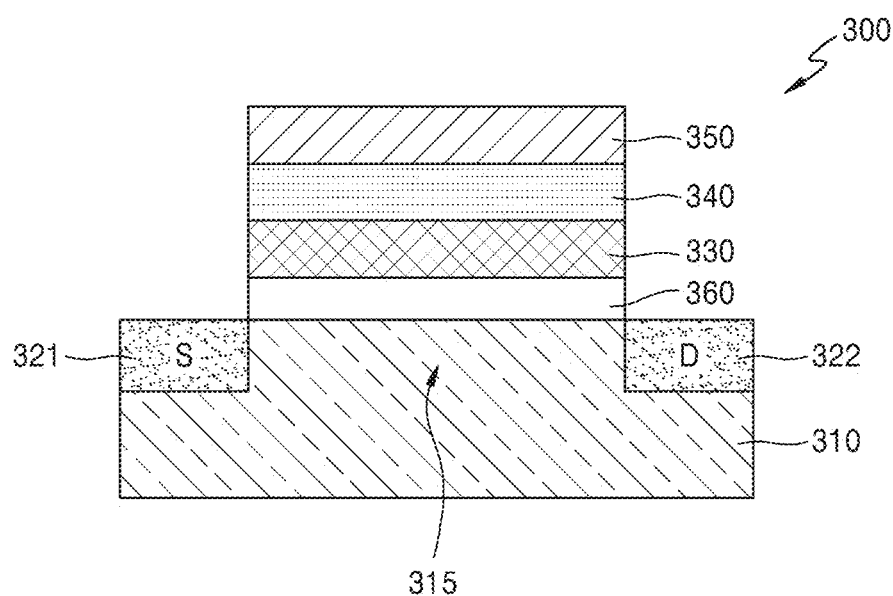
FIG. 4 is a cross-sectional view of an electronic device according to another example embodiment.

FIG. 4 is a cross-sectional view of an electronic device 300 according to another example embodiment. The following description is focused on differences from the aforedescribed embodiments.

Referring to FIG. 4, the electronic device 300 includes a substrate 310, and an insulating layer 360, a carbon layer 330, a ferroelectric layer 340, and a gate electrode 350 sequentially stacked on the substrate 310, wherein the carbon layer 330 may have an $sp^2$ bonding structure. A channel element 315 may be provided in the substrate 310 at a location corresponding to the gate electrode 350, and a source (S) 321 and a drain (D) 322 may be provided at both sides of the channel element 315.

The source 321 may be electrically connected to a side of the channel element 315, and the drain 322 may be electrically connected to the other side of the channel element 315. The source 321 and the drain 322 may be formed by implanting impurities into different regions of the substrate 310, and a region of the substrate 310 between the source 321 and the drain 322 may be defined as the channel element 315. The substrate 310 may be a semiconductor substrate. For example the substrate 310 may be a Si, Ge, SiGe, or a group III-V semiconductor, but is not limited thereto. Meanwhile, the channel element 315 may not be provided as a part of the substrate 310 and may be provided as a material layer separate from the substrate 310.

The insulating layer 360 may be provided on an upper surface of the channel element 315. The insulating layer 360 may have a small thickness of greater than 0 nm and equal to or less than, for example, about 5 nm. However, the insulating layer 360 is not limited thereto and may have a thickness greater than about 5 nm. The insulating layer 360 may include, for example, Si oxide, Al oxide, Hf oxide, Zr oxide, or a 2D insulator such as hexagonal boron nitride (h-BN). However, the material of the insulating layer 360 is not limited thereto and may be changed. The insulating layer 360 may serve to suppress or prevent electrical leakage and may also be used for capacitance matching in a gate stack structure.

The carbon layer 330 having an $sp^2$ bonding structure may be provided on an upper surface of the insulating layer 360. Herein, the carbon layer 330 having an $sp^2$ bonding structure may include nanocrystalline graphene including nano-sized crystals. Herein, nanocrystalline graphene may include crystals smaller than those of normal crystalline graphene. Specifically, for example, nanocrystalline graphene may include crystals having a size of about 0.5 nm to about 100 nm. A ratio of carbon having an $sp^2$ bonding structure to total carbon may be, for example, about 50% to about 99%. Nanocrystalline graphene may contain, for example, about 1 at % to about 20 at % of hydrogen. Nanocrystalline graphene may have a density of, for example, about 1.6 g/cc to about 2.1 g/cc and a sheet resistance greater than, for example, about 1,000 Ohm/sq.

The carbon layer 330 having an $sp^2$ bonding structure may have a thickness of about 0.4 nm to about 100 nm. For example, the carbon layer 330 may have a thickness of about 0.4 nm to about 10 nm. However, the carbon layer 330 is not limited thereto. As described above, the carbon layer 330 having an $sp^2$ bonding structure may limit and/or prevent diffusion of metal or oxygen in the ferroelectric layer 340 through the insulating layer 360 into the substrate 310. In addition, since the diffusion limitation and/or prevention effect is achievable even when the carbon layer 330 having an $sp^2$ bonding structure may have a small thickness of about 1 nm, a total thickness of the electronic device 300 may be reduced. Therefore, the electronic device 100 may be easily scaled down. The carbon layer 330 having an $sp^2$ bonding structure may have a high charge density and thus may increase uniformity in characteristics of the electronic device 300.

The ferroelectric layer 340 may be provided on an upper surface of the carbon layer 330 having an $sp^2$ bonding structure. The ferroelectric layer 340 may include an oxide including at least one of, for example, Si, Al, Hf, and Zr. Specifically, for example, the ferroelectric layer 340 may include at least one of Hf-based oxide and Zr-based oxide. Herein, the Hf-based oxide may include, for example, HfO or HfZrO, and the Zr-based oxide may include, for example, ZrO.

In some embodiments, the ferroelectric layer 340 may further include a dopant. The dopant may include at least one of, for example, Si, Al, Zr, Y, La, Gd, Sr, and Hf, but is not limited thereto. When the ferroelectric layer 340 includes the dopant, the dopant may be doped at the same concentration everywhere or doped at different concentrations in different regions. Alternatively, different regions of the ferroelectric layer 340 may be doped with different dopants.

The gate electrode 350 may be provided on an upper surface of the ferroelectric layer 340. The gate electrode 350 may include a conductive metal. Alternatively, the gate electrode 350 may include a carbon material having an $sp^2$ bonding structure. Herein, the carbon material having an $sp^2$ bonding structure may include, for example, normal crystalline graphene or nanocrystalline graphene. Due to the ferroelectric layer 340, a SS of the electronic device 300 may be lowered.

Figure 5:
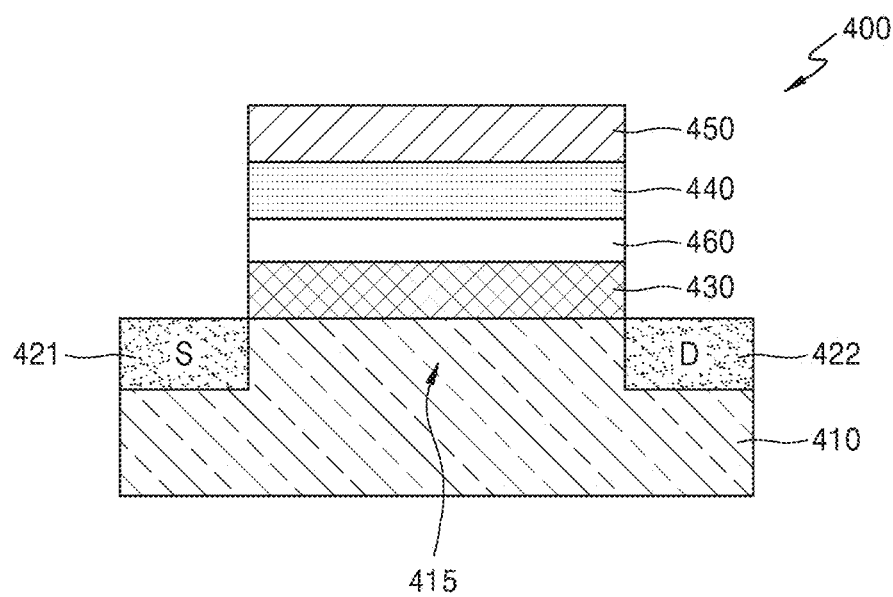
FIG. 5 is a cross-sectional view of an electronic device according to another example embodiment.

FIG. 5 is a cross-sectional view of an electronic device 400 according to another example embodiment. The following description is focused on differences from the afore-described embodiments.

Referring to FIG. 5, the electronic device 400 includes a substrate 410, and a carbon layer 430, an insulating layer 460, a ferroelectric layer 440, and a gate electrode 450 sequentially stacked on the substrate 410, wherein the carbon layer 430 may have an $sp^2$ bonding structure. A channel element 415 may be provided in the substrate 410 at a location corresponding to the gate electrode 450, and a source (S) 421 and a drain (D) 422 may be provided at both sides of the channel element 415.

The carbon layer 430 having an $sp^2$ bonding structure may be provided on an upper surface of the channel element 415. Herein, the carbon layer 430 having an $sp^2$ bonding structure may include nanocrystalline graphene including nano-sized crystals. The carbon layer 430 having an $sp^2$ bonding structure may have a thickness of about 0.4 nm to about 100 nm. The insulating layer 460 may be provided on an upper surface of the carbon layer 430 having an $sp^2$ bonding structure. The insulating layer 460 may have a small thickness equal to or less than, for example, about 5 nm. However, the insulating layer 460 is not limited thereto. The insulating layer 460 may include, for example, Si oxide, Al oxide, Hf oxide, Zr oxide, or a 2D insulator such as h-BN.

The ferroelectric layer 440 may be provided on an upper surface of the insulating layer 460. The ferroelectric layer 440 may include an oxide including at least one of, for example, Si, Al, Hf, and Zr. The ferroelectric layer 440 may further include a dopant. The dopant may include at least one of, for example, Si, Al, Zr, Y, La, Gd, Sr, and Hf, but is not limited thereto. The gate electrode 450 may be provided on an upper surface of the ferroelectric layer 440. The gate electrode 450 may include a conductive metal or a carbon material having an $sp^2$ bonding structure.

FIGS. 6A to 6F are cross-sectional views for describing a method of manufacturing an electronic device 500, according to an example embodiment.

Figure 6A:
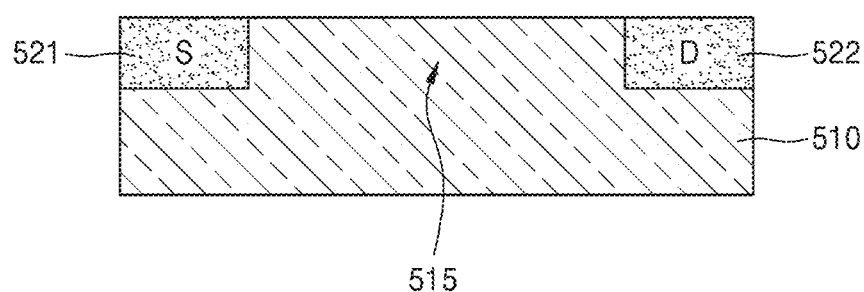
FIGS. 6A to 6F are cross-sectional views for describing a method of manufacturing an electronic device, according to an example embodiment.

Referring to FIG. 6A, a substrate 510 including a channel element 515, a source (S) 521, and a drain (D) 522 may be prepared. The source 521 and the drain 522 may be formed by implanting impurities into different regions of the substrate 510, and a region of the substrate 510 between the source 521 and the drain 522 may be defined as the channel element 515. The substrate 510 may include a semiconductor (e.g., Si, Ge, SiGe, or a group III-V semiconductor). In this case, the channel element 515 may also include Si, Ge, SiGe, or a group III-V semiconductor like the substrate 510. The material of the substrate 510 is not limited to the above-mentioned examples and may be variously changed. The timing at which the source 521 and the drain 522 are formed may vary. For example, the source 521 and the drain 522 may be formed in the substrate 510 after a gate electrode 550 (see FIG. 6D) may be formed as will be described below.

The channel element 515 may not be formed as a part of the substrate 510 and may be formed on an upper surface of the substrate 510 as a material layer separate from the substrate 510. In this case, the channel element 515 may include various materials. For example, the channel element 515 may include at least one of, for example, an oxide semiconductor, a nitride semiconductor, an oxynitride semiconductor, a 2D material, QDs, and an organic semiconductor. The oxide semiconductor may include, for example, InGaZnO, the 2D material may include, for example, TMD or graphene, and the QDs may include, for example, colloidal or nanocrystal QDs. However, the above-mentioned materials are merely examples and the current embodiment is not limited thereto.

Figure 6B:
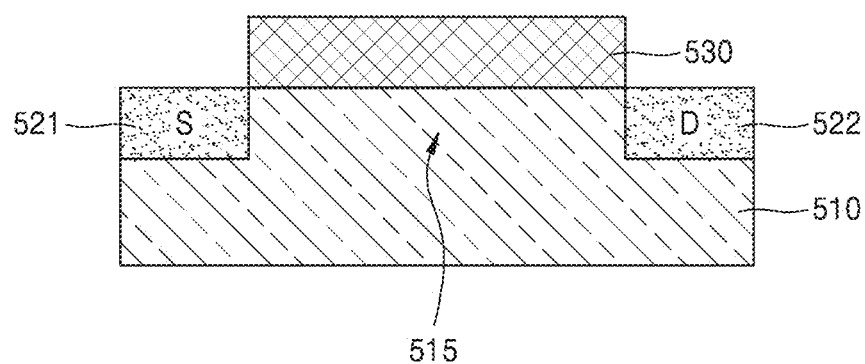

Referring to FIG. 6B, a carbon layer 530 having an $sp^2$ bonding structure may be formed on an upper surface of the channel element 515 of the substrate 510. Herein, the carbon layer 530 having an $sp^2$ bonding structure may include nanocrystalline graphene including nano-sized crystals. For example, nanocrystalline graphene may include crystals having a size of about 0.5 nm to about 100 nm. In nanocrystalline graphene, a ratio of carbon having an $sp^2$ bonding structure to total carbon may be about 50% to about 99%, and about 1 at % to about 20 at % of hydrogen may be contained. Nanocrystalline graphene may have a density of, for example, about 1.6 g/cc to about 2.1 g/cc and a sheet resistance greater than, for example, about 1,000 Ohm/sq.

The carbon layer 530 having an $sp^2$ bonding structure may be formed by depositing nanocrystalline graphene on the upper surface of the channel element 515 of the substrate 510 by, for example, CVD or ALD. Herein, the carbon layer 530 having an $sp^2$ bonding structure may include, for example, about 1 layer to about 100 layers of nanocrystalline graphene, but is not limited thereto. The carbon layer 130 may have a thickness of about 0.4 nm to about 100 nm, but is not limited thereto.

Figure 6C:
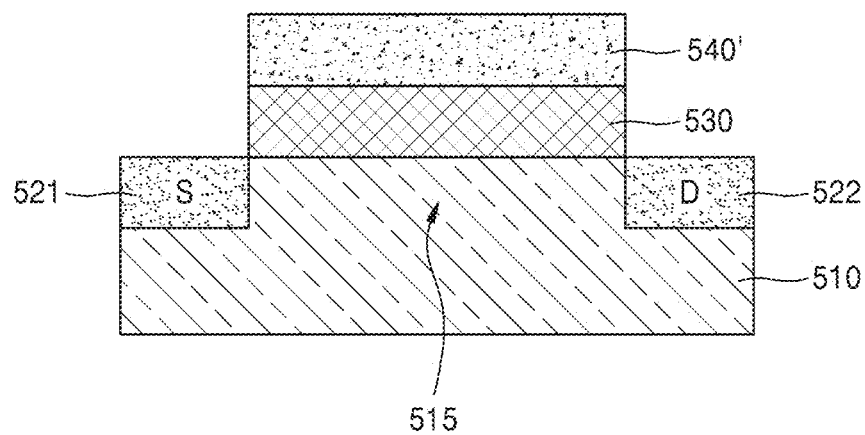

Referring to FIG. 6C, an amorphous ferroelectric layer 540' may be formed on an upper surface of the carbon layer 530 having an $sp^2$ bonding structure. The amorphous ferroelectric layer 540' may be formed by depositing a certain ferroelectric material on the upper surface of the carbon layer 530 having an $sp^2$ bonding structure, through, for example, CVD or ALD.

The amorphous ferroelectric layer 540' may be a thin film having a high dielectric constant. For example, the dielectric constant of the amorphous ferroelectric layer 540' may be equal to or greater than about 10. Therefore, the amorphous ferroelectric layer 540' may serve as a high-k dielectric layer. The amorphous ferroelectric layer 540' may include an oxide including at least one of, for example, Si, Al, Hf, and Zr. Specifically, for example, the amorphous ferroelectric layer 540' may include at least one of Hf-based oxide and Zr-based oxide. Herein, the Hf-based oxide may include, for example, HfO or HfZrO, and the Zr-based oxide may include, for example, ZrO. The amorphous ferroelectric layer 540' may further include a dopant. Herein, the dopant may include at least one of Si, Al, Zr, Y, La, Gd, Sr, and Hf. When the amorphous ferroelectric layer 540' includes the dopant, the dopant may be doped at the same concentration everywhere or doped at different concentrations in different regions. Alternatively, different regions of the amorphous ferroelectric layer 540' may be doped with different dopants. The amorphous ferroelectric layer 540' may be doped while the amorphous ferroelectric layer 540' is being formed, or doped in a separate process after the amorphous ferroelectric layer 540' is formed.

Figure 6D:
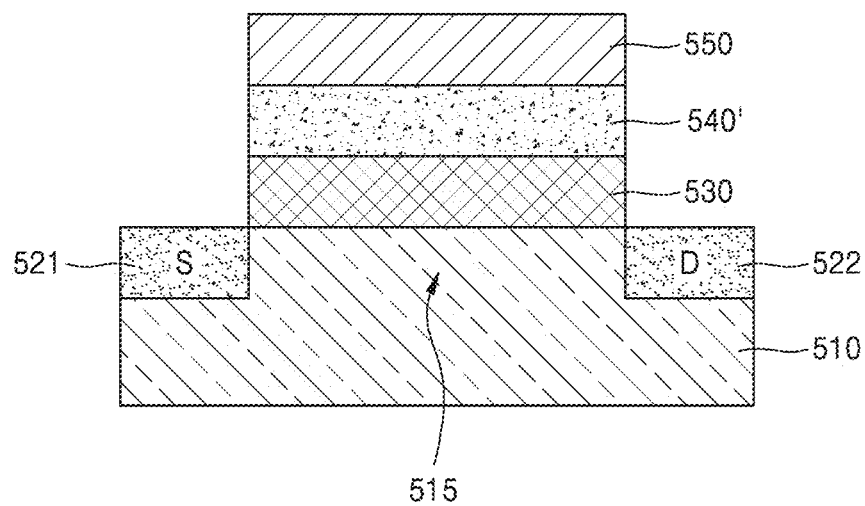

Referring to FIG. 6D, a gate electrode 550 may be formed on an upper surface of the amorphous ferroelectric layer 540'. The gate electrode 550 may be formed by depositing a conductive material on the upper surface of the amorphous ferroelectric layer 540' by, for example, CVD, physical vapor deposition (PVD), or ALD. The gate electrode 550 may include a conductive metal. Alternatively, the gate electrode 550 may include a carbon material having an $sp^2$ bonding structure. Herein, the carbon material having an $sp^2$ bonding structure may include, for example, normal crystalline graphene or nanocrystalline graphene.

Figure 6E:
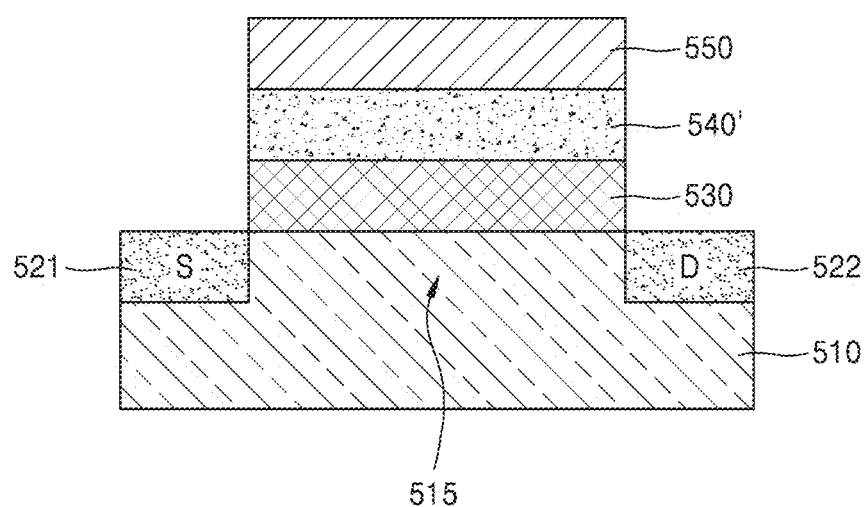
Figure 6F:
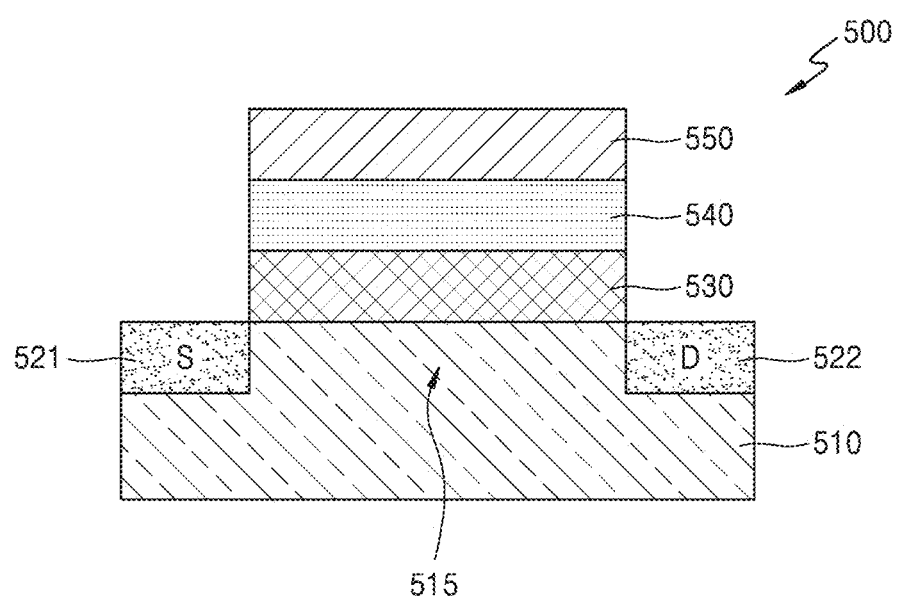

Referring to FIG. 6E, an annealing process for crystallizing the amorphous ferroelectric layer 540' is performed. The annealing process may be performed at a temperature of, for example, about 400° C. to about 1,000° C. The annealing process may be performed within about 1 min. However, the temperature and time of the annealing process are not limited thereto and may be variously changed. The amorphous ferroelectric layer 540' may be crystallized through the annealing process. When the amorphous ferroelectric layer 540' is completely crystallized, a ferroelectric layer 540 may be obtained as illustrated in FIG. 6F and thus the electronic device 500 may be manufactured.

The above-described method of manufacturing the electronic device 500 may further include generating an insulating layer (not shown) on the upper surface of the channel element 515 of the substrate 510, before the carbon layer 530 having an $sp^2$ bonding structure is formed. In this case, the carbon layer 530 having an $sp^2$ bonding structure may be formed on an upper surface of the insulating layer. The insulating layer may be formed by depositing a certain insulating material on the upper surface of the channel element 515 of the substrate 510 by, for example, CVD or ALD. The insulating layer may have a small thickness equal to or less than, for example, about 5 nm, but is not limited thereto. The insulating layer may include, for example, Si oxide, Al oxide, Hf oxide, Zr oxide, or a 2D insulator such as h-BN, but is not limited thereto.

The above-described method of manufacturing the electronic device 500 may further include generating an insulating layer (not shown) on the upper surface of the carbon layer 530 having an $sp^2$ bonding structure, after the carbon layer 530 having an $sp^2$ bonding structure is formed and before the amorphous ferroelectric layer 540' is formed. In this case, the amorphous ferroelectric layer 540' may be formed on an upper surface of the insulating layer.

Figure 7A:
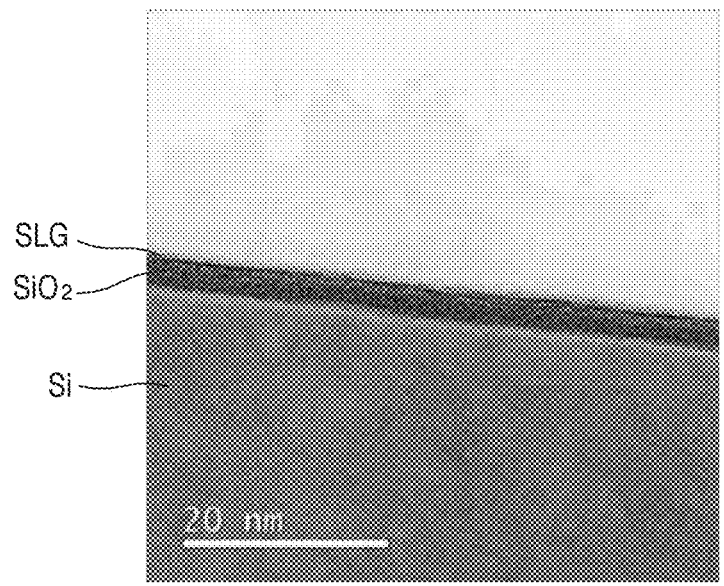
FIG. 7A is a scanning electron microscopy (SEM) image of crystalline graphene (SLG) formed on a silicon (Si) substrate.
Figure 7B:
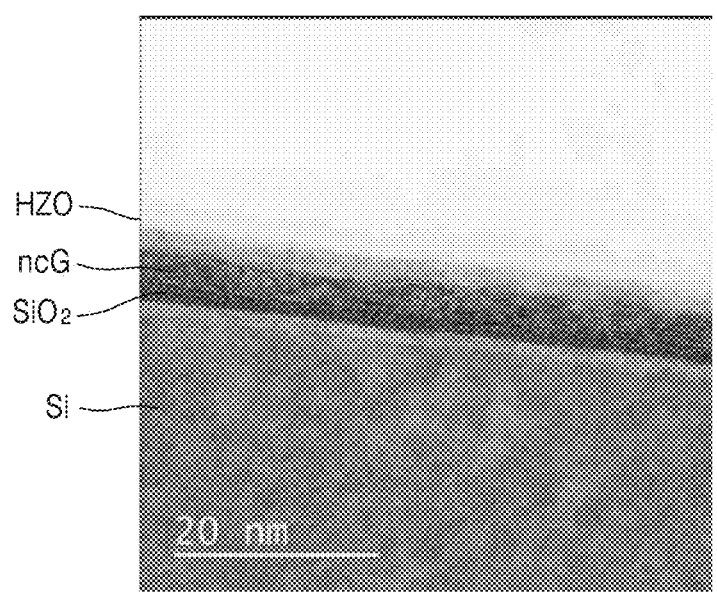
FIG. 7B is a SEM image of nanocrystalline graphene (ncG) and hafnium zirconium oxide (HZO) formed on a Si substrate.

FIG. 7A is a scanning electron microscopy (SEM) image of normal crystalline graphene (SLG) formed on a Si substrate. In FIG. 7A, SLG denotes single layer graphene. FIG. 7B is a SEM image of nanocrystalline graphene (ncG) and hafnium zirconium oxide (HZO) formed on a Si substrate.

Referring to FIG. 7A, a $SiO_2$ insulating layer may be formed on an upper surface of the Si substrate, and SLG may be formed on an upper surface of the $SiO_2$ insulating layer. Herein, it is shown that a ferroelectric layer such as HZO is not formed on an upper surface of SLG.

Referring to FIG. 7B, a $SiO_2$ insulating layer may be formed on an upper surface of the Si substrate, and ncG may be formed on an upper surface of the $SiO_2$ insulating layer. HZO serving as a ferroelectric layer may be formed to a thickness of about 3 nm on an upper surface of ncG. Therefore, it is shown that ncG provides a high adhesive force to the ferroelectric layer formed thereon.

FIGS. 8A through 8D illustrate a method of manufacturing an electronic device according to an example embodiment.

Figure 8A:
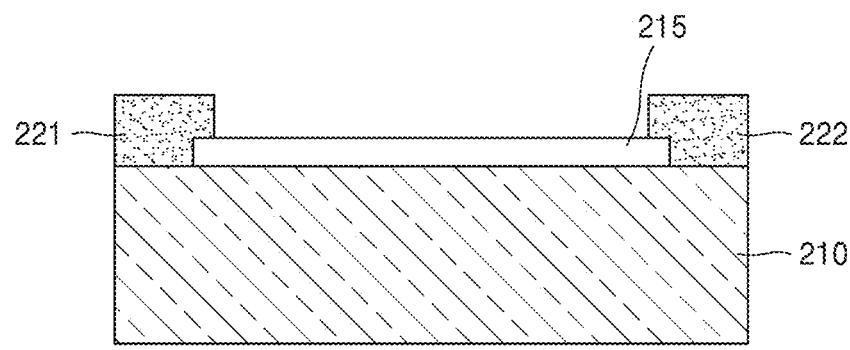
FIGS. 8A through 8D illustrate a method of manufacturing an electronic device according to an example embodiment.

Referring to FIG. 8A, a channel film may be formed on the substrate 210 and patterned into the channel layer 215. Then, the source electrode 221 and drain electrode 222 may be formed on ends of the channel layer 215.

Figure 8B:
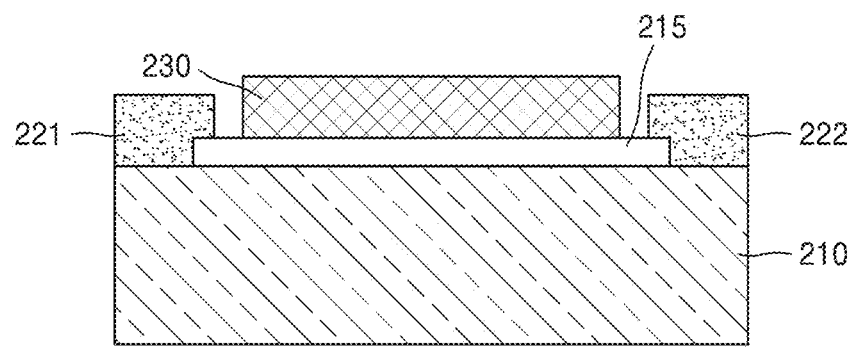

Referring to FIG. 8B, the carbon layer 230 may then be formed on the channel layer 215. The carbon layer 230 may be patterned as shown in FIG. 8B such that sides of the carbon layer 230 may be spaced apart from the source electrode 221 and drain electrode 222.

Figure 8C:
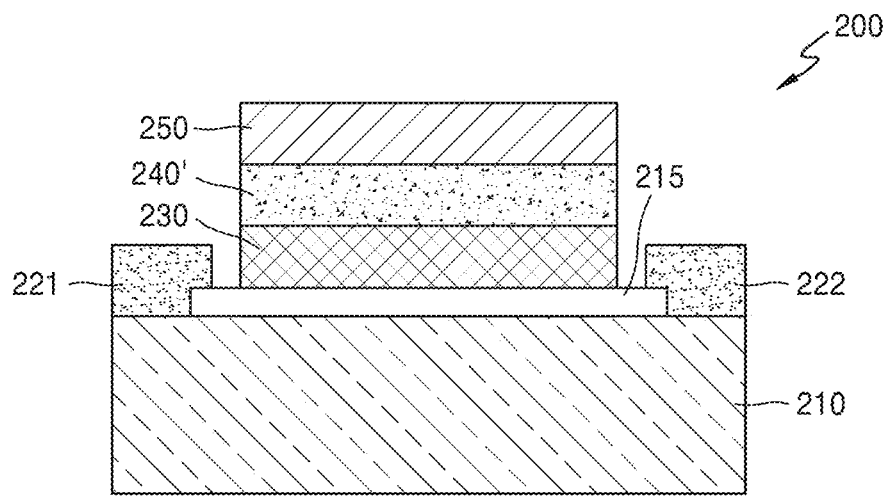

Referring to FIG. 8C, an amorphous ferroelectric layer 240' and a gate electrode 250 may be formed on the carbon layer 230.

Figure 8D:
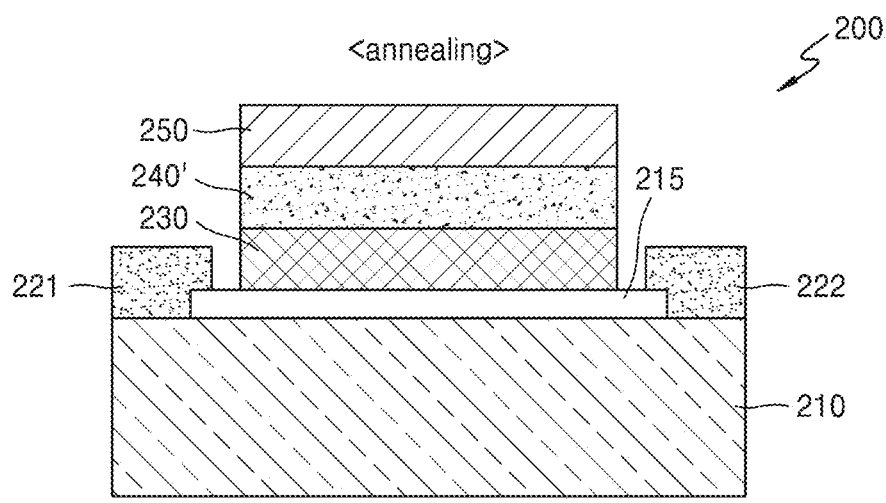

Referring to FIG. 8D, an annealing process may be performed on the amorphous ferroelectric layer 240'. The annealing process may crystallize the amorphous ferroelectric layer 240' into ferroelectric layer 240 shown in FIG. 3.

FIGS. 9A through 9D illustrate a method of manufacturing an electronic device according to an example embodiment.

Figure 9A:
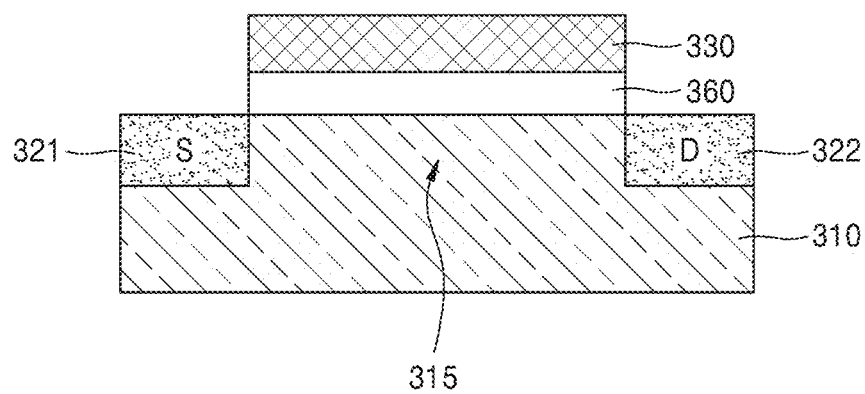
FIGS. 9A through 9D illustrate a method of manufacturing an electronic device according to an example embodiment.
Figure 9B:
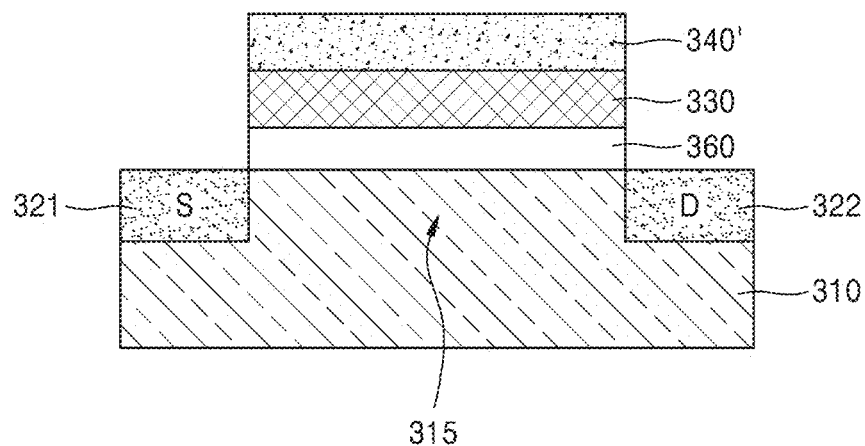
Figure 9C:
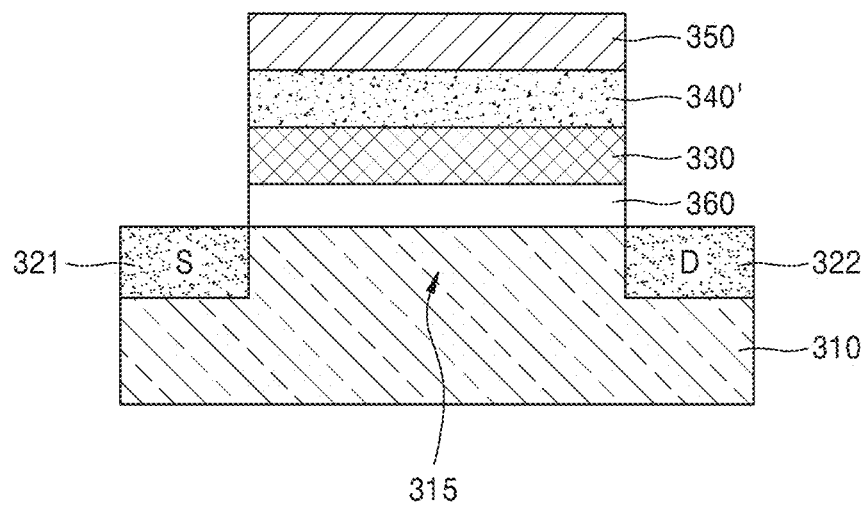

FIGS. 9A to 9C are similar to FIGS. 6B to 6F, except the insulating layer 360 may be formed before forming the carbon layer 330.

Referring to FIG. 9A, the insulating layer 360 may be formed on the substrate 310 and the carbon layer 330 may be formed on the insulating layer 330. The insulating layer 360 may be formed directly on the substrate 310.

Referring to FIG. 9B, the amorphous ferroelectric layer 340' may be formed on the carbon layer 330.

Referring to FIG. 9C, the gate electrode 350 may be formed on the amorphous ferroelectric layer 340'.

Figure 9D:
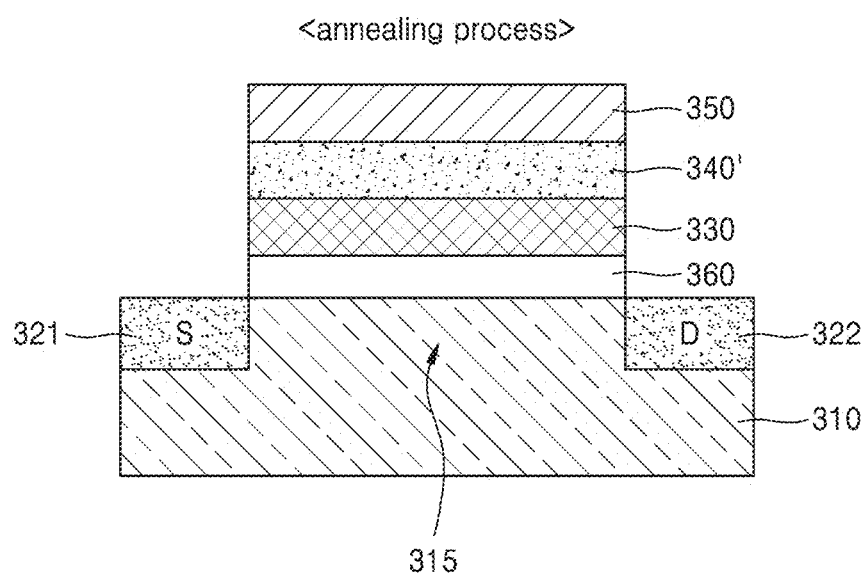

Referring to FIG. 9D, an annealing process may be performed on the amorphous ferroelectric layer 340'. The annealing process may crystallize the amorphous ferroelectric layer 340' into ferroelectric layer 340 shown in FIG. 4.

According to afore-described embodiments, using a ferroelectric layer, an electronic device capable of lowering a SS by voltage amplification occurring due to domain switching in a ferroelectric may be implemented. Furthermore, by providing a carbon layer having an $sp^2$ bonding structure between the ferroelectric layer and a channel element, diffusion of metal or oxygen in the ferroelectric layer into a substrate in an annealing process may be limited and/or prevented. As such, current leakage may be limited and/or prevented and formation of an undesired Si oxide layer or silicide may also be limited and/or prevented. In addition, since the diffusion limitation and/or prevention effect is achievable even when the carbon layer having an $sp^2$ bonding structure may have a small thickness of about 1 nm, a total thickness of the electronic device may be reduced. Therefore, the electronic device may be easily scaled down.

Since the carbon layer having an $sp^2$ bonding structure may have a high charge density, an equipotential may be formed between the carbon layer and the channel element. Therefore, the carbon layer having an $sp^2$ bonding structure may screen a non-uniform electric potential due to a multi-domain structure of the ferroelectric layer and thus may increase uniformity in characteristics of the electronic device. The carbon layer including nanocrystalline graphene may provide a high adhesive force to the ferroelectric layer deposited thereon.

It should be understood that embodiments described herein should be considered in a descriptive sense only and not for purposes of limitation. Descriptions of features or aspects within each embodiment should be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing an electronic device, the method comprising:
   preparing a substrate including a channel element;
   depositing a carbon layer on the channel element, the carbon layer having an $sp^2$ bonding structure;
   depositing a ferroelectric layer on the carbon layer;
   depositing a gate electrode on the ferroelectric layer; and
   crystallizing the ferroelectric layer through an annealing process.

2. The method of claim 1, wherein the preparing the substrate including forming a source and a drain at both sides of the channel element.

3. The method of claim 1, further comprising:
   generating an insulating layer between the substrate and the carbon layer.

4. The method of claim 1, further comprising:
   generating an insulating layer between the carbon layer and the ferroelectric layer.

5. The method of claim 1, wherein the depositing the carbon layer is performed by chemical vapor deposition (CVD) or atomic layer deposition (ALD).

6. The method of claim 1, wherein the carbon layer includes nanocrystalline graphene including nano-sized crystals.

7. The method of claim 1, wherein the depositing the carbon layer includes forming the carbon layer so a thickness of the carbon layer is in a range of 0.4 nm to 100 nm.

8. The method of claim 1, wherein the depositing the ferroelectric layer is performed by CVD or ALD.

* * * * *